(12) United States Patent
Araujo

(10) Patent No.: US 7,738,253 B2
(45) Date of Patent: Jun. 15, 2010

(54) POWER SUPPLY ASSEMBLY

(76) Inventor: Richard Alberto Araujo, 9155 Valley Spring Ct., Las Vegas, NV (US) 89147

( * ) Notice: Subject to any disclaimer, the term of this patent is extended or adjusted under 35 U.S.C. 154(b) by 543 days.

(21) Appl. No.: 11/550,124

(22) Filed: Oct. 17, 2006

(65) Prior Publication Data

US 2007/0086171 A1  Apr. 19, 2007

Related U.S. Application Data

(63) Continuation of application No. 10/959,648, filed on Oct. 7, 2004, now Pat. No. 7,154,755.

(60) Provisional application No. 60/561,209, filed on Apr. 12, 2004.

(51) Int. Cl.
*H05K 7/20* (2006.01)
*H05K 5/00* (2006.01)
*H05K 1/00* (2006.01)

(52) U.S. Cl. .................. 361/720; 361/600; 361/715; 361/728; 361/796; 174/50; 174/52.1

(58) Field of Classification Search .............. None
See application file for complete search history.

(56) References Cited

U.S. PATENT DOCUMENTS

| | | | | | |
|---|---|---|---|---|---|
| 4,384,368 | A | * | 5/1983 | Rosenfeldt et al. | 398/140 |
| 4,872,102 | A | * | 10/1989 | Getter | 363/141 |
| 5,457,607 | A | * | 10/1995 | Carvalho | 361/740 |
| 5,550,713 | A | * | 8/1996 | Pressler et al. | 361/818 |

* cited by examiner

*Primary Examiner*—Boris L Chervinsky
(74) *Attorney, Agent, or Firm*—McNeely & Hare LLP

(57) ABSTRACT

A power supply assembly includes a housing having side walls, end walls, and a bottom wall defining a rectangular box with an interior space and an open top. A first dividing wall and a second dividing wall are positioned in the interior space of the housing which divides the interior space into first, second, and third compartments.

A method of manufacturing a power supply with the above power supply assembly includes installing a printed circuit board in the second compartment and positioning the first wire set to terminate in the first compartment and the second wire set to terminate in the third compartment.

15 Claims, 10 Drawing Sheets

100

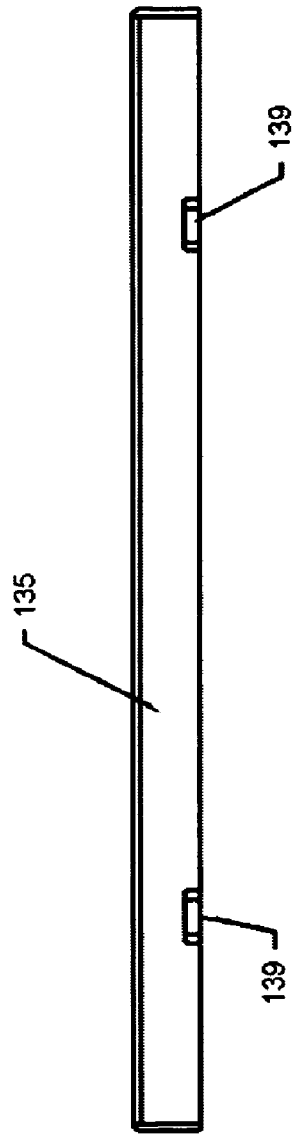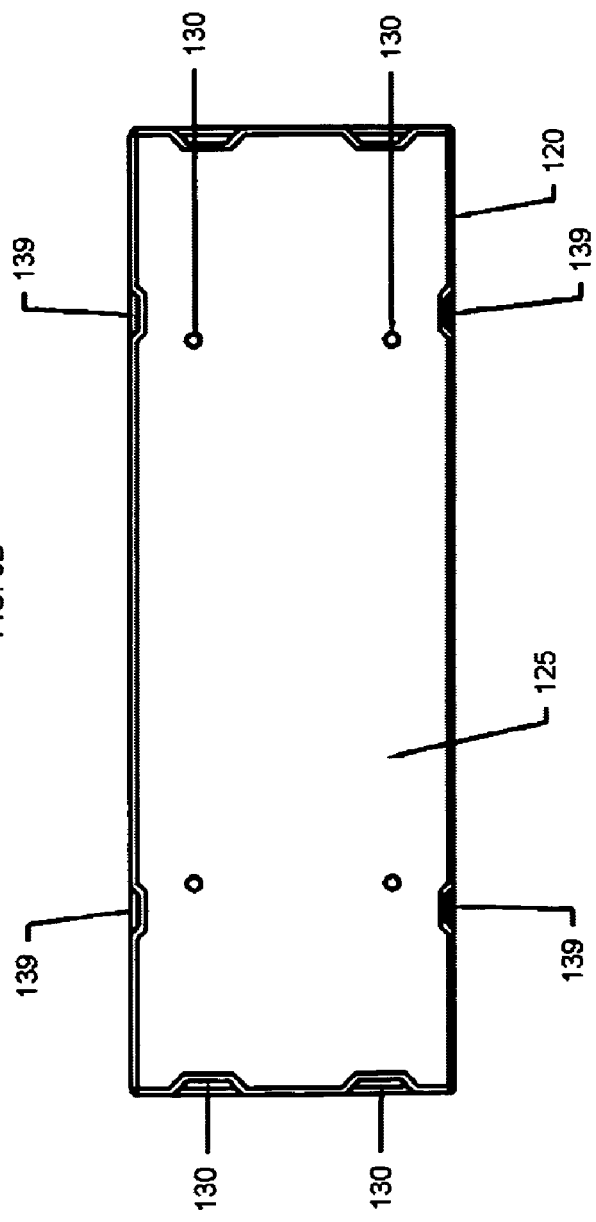

POWER SUPPLY ASSEMBLY

CROSS REFERENCE TO RELATED APPLICATION

This application is a continuation of U.S. Pat. Ser. No. 10/959,648 filed on Oct. 7, 2004, now U.S. Pat. No. 7,154,755 and claims priority to U.S. Provisional Patent Application No. 60/561,209 dated Apr. 12, 2004, which are incorporated by reference herein.

FIELD OF THE INVENTION

The present invention relates to power supply assemblies, and more specifically, a weather-resistant power supply assembly for outdoor use.

BACKGROUND

Power supplies are sometimes used in outdoor environments where they can be exposed to damage from weather conditions, such as, for example, rain and high humidity. Some power supplies are resistant to weather damage by using a sealed outer housing with wires extending through watertight ports to make external wiring connections. However, the external wiring connections remain exposed to harsh conditions, which can cause deterioration of the wiring connections. In addition, the housing may need to be disassembled in the field in order to adjust certain operating characteristics thereby exposing the electrical components to potential damage.

SUMMARY

The present invention provides a water-tight power supply assembly that protects AC and DC wiring connections in separate compartments and provides easy access to the wiring and allows operating adjustments while protecting the active electrical components from damage.

In one general aspect, a power supply assembly includes a housing having side walls, end walls, and a bottom wall defining a rectangular box with an interior space and an open top. A first dividing wall and a second dividing wall are positioned in the interior space of the housing which divide the interior space into first, second, and third compartments.

Implementations may include one or more of the following features. For example, the first dividing wall may have a first port providing access between the first compartment and the second compartment and the second dividing wall may have a second port between the second compartment and the third compartment.

A printed circuit board may be installed in the second compartment and the printed circuit board may have alternating current wires and direct current wires extending from opposing ends. In this implementation, the alternating current wires extend through the first port into the first compartment and the direct current wires extend through the second port into the third compartment.

An inner lid may be attached to the first dividing wall and the second dividing wall thereby enclosing the second compartment. In one implementation, the first and second dividing wall have cut-out areas and the inner lid has a pair of matching protrusions or flanges extending partially into the cutout areas to define a first port between the first and second compartments and a second port between the second and third compartments. Electrical features of the power supply may be adjusted by accessing the printed circuit board through current and voltage adjustment ports in the inner lid.

In another implementation, an outer lid covers the open top of the housing thereby enclosing the first, second, and third compartments. In a further implementation, the first compartment is used as an alternating current wiring connection compartment, the second compartment is used as a printed circuit board compartment, and the third compartment is used as a direct current wiring compartment. A printed circuit board installed in the printed circuit board compartment may have a U-shaped heat sink which fastens to the housing and/or the printed circuit board may have alternating current wiring connections extending into the alternating current wiring compartment and direct current wiring connections extending into the direct current wiring compartment. Each end wall and side wall of the housing may have ports configured to receive electrical conduit.

In another general aspect, a method of manufacturing a power supply that has a housing with a first, a second, and a third compartment, an inner lid, an outer cover, and a printed circuit board having a first wire set and a second wire set at opposing ends, includes installing the printed circuit board PCB in the second compartment and positioning the first wire set to terminate in the first compartment and the second wire set to terminate in the third compartment.

The method may include one or more of the features outlined above and one or more of the following features. For example, the method may include routing the first wire set through a first opening between the first compartment and the second compartment and routing the second wire set through a second opening between the second compartment and the third compartment.

In another implementation, the method includes enclosing the second compartment with the inner lid, the inner lid having protrusions that extend partly into the first opening to define a first port and partly into the second opening to define a second port. In further implementations, the method includes inserting grommets in the first opening and the second opening, attaching the outer cover to the housing, and/or bonding a gasket to the outer cover.

In another general aspect, a method of installing a power supply having a housing with an interior space divided into an alternating current wiring compartment, a printed circuit board wiring compartment, and a direct current wiring compartment, an inner lid enclosing the printed circuit board compartment and an outer cover enclosing the interior space, includes connecting alternating current wires in the alternating current wiring compartment to an alternating current power source, connecting direct current wires in the direct current wiring compartment to a direct current receiving load, and attaching the outer cover.

The method may include features outline above or may also include one or more of the following features. For example, the method may include removing the outer cover thereby exposing the alternating current wiring compartment and the direct current wiring compartment. The method may also include inserting a tool through a port in the inner lid to access a power supply control, and manipulating the power supply control to set an operating characteristic of the power supply.

DESCRIPTION OF THE DRAWINGS

FIGS. 6A and 6B are side and top views of an outer cover.

Figure 1:
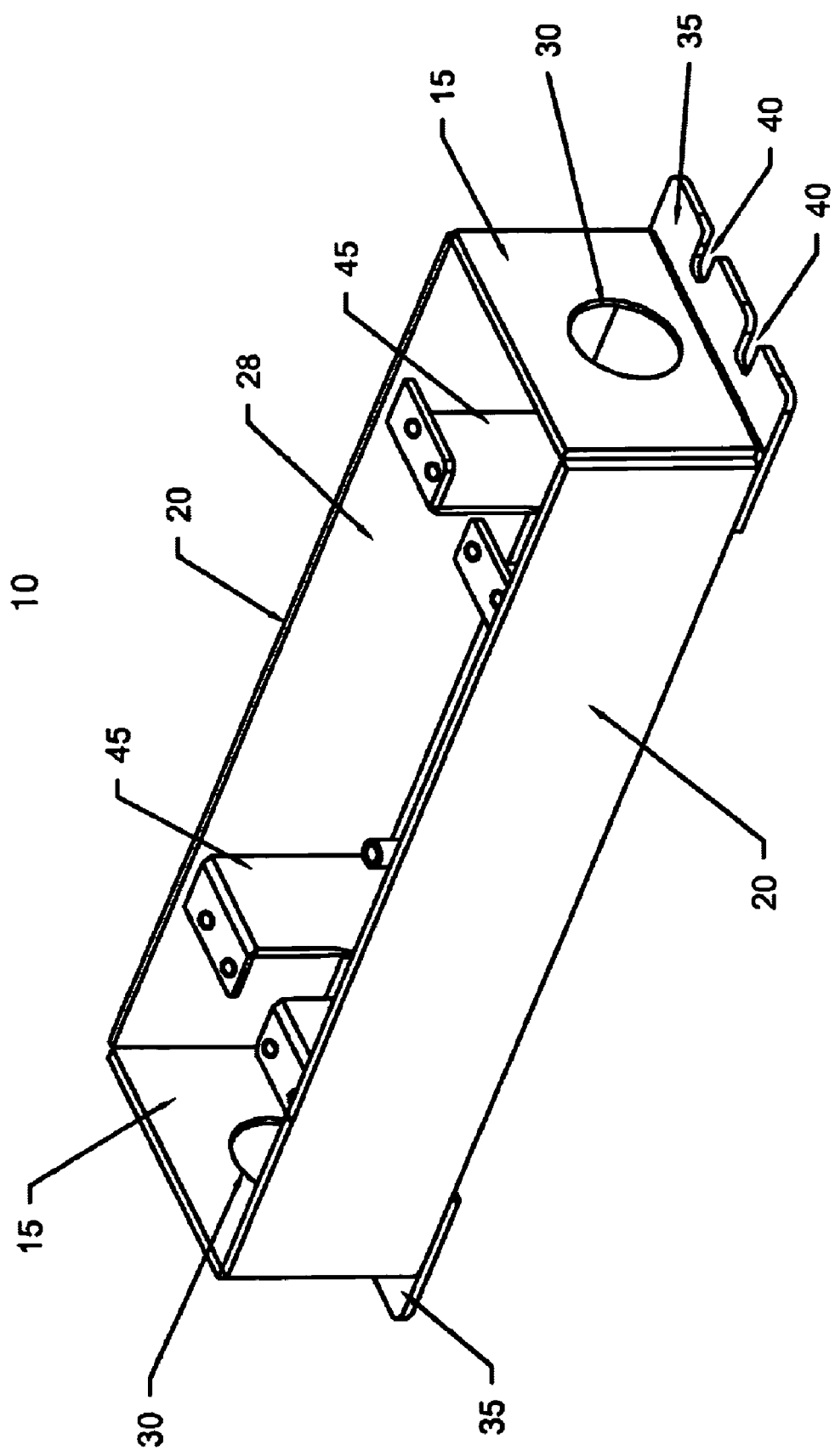
FIG. 1 is a perspective view of a power supply housing.

Reference numerals in the drawings correspond to numbers in the Detailed Description for ease of reference.

DETAILED DESCRIPTION

Figure 2:
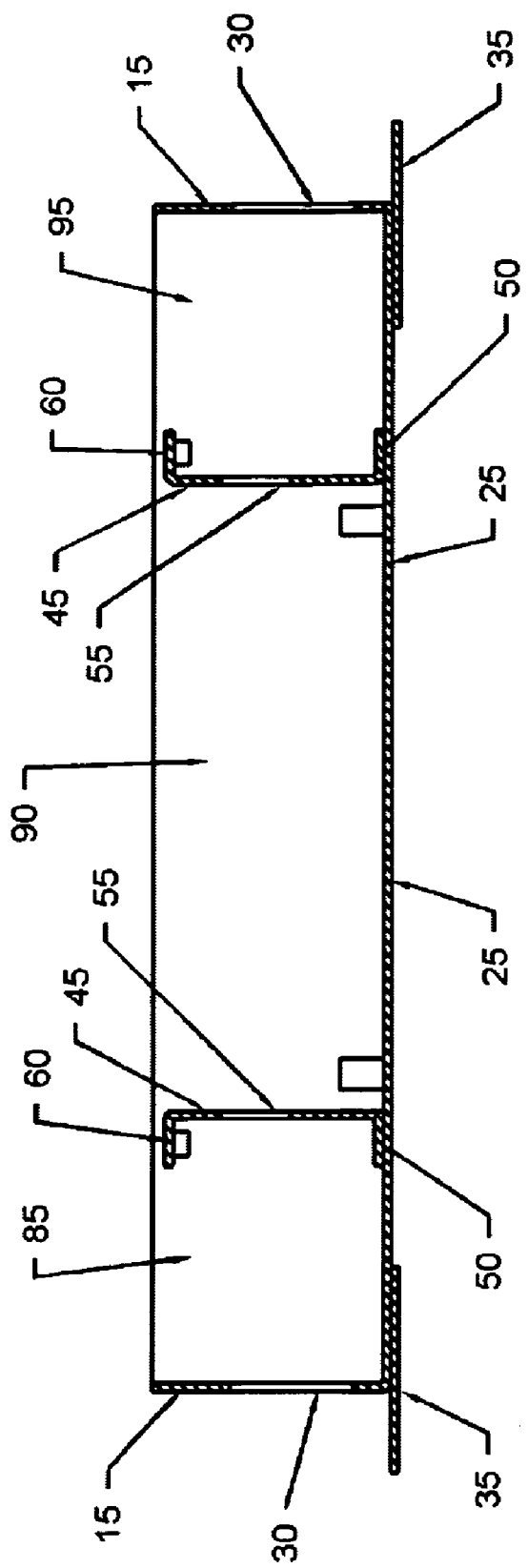
FIG. 2 is a side cross-sectional view of the power supply housing.

Referring to FIGS. 1 and 2, a power supply housing 10 is a generally rectangular box that includes end walls 15, side walls 20, and a bottom wall 25. An open top 28 exposes the interior space of the housing 10. Apertures 30 are circular openings positioned approximately in the center of each of the side walls 20.

Figure 3:
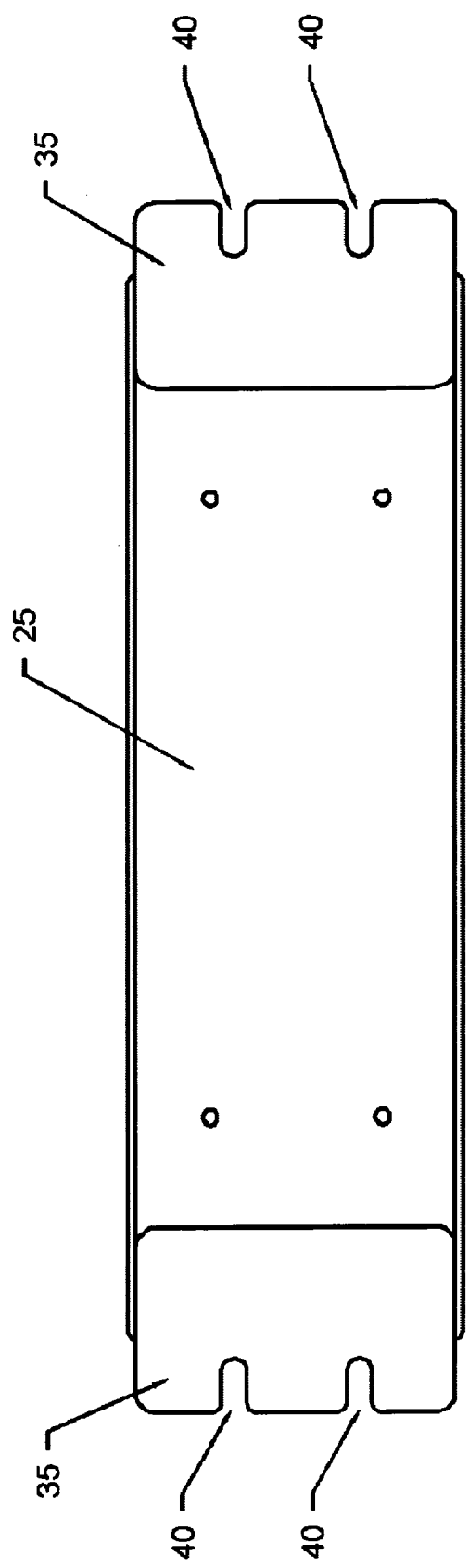
FIG. 3 is a bottom view of the power supply housing.

Referring to FIG. 3, mounting brackets 35 attach to the bottom wall 25 of the housing 10 such that a portion of the mounting brackets 35 extend beyond the side walls 20. The mounting brackets 35 are flat and generally rectangular with screw recesses 40 configured to receive screws that mount the housing 10 to an exterior surface.

Figure 4:
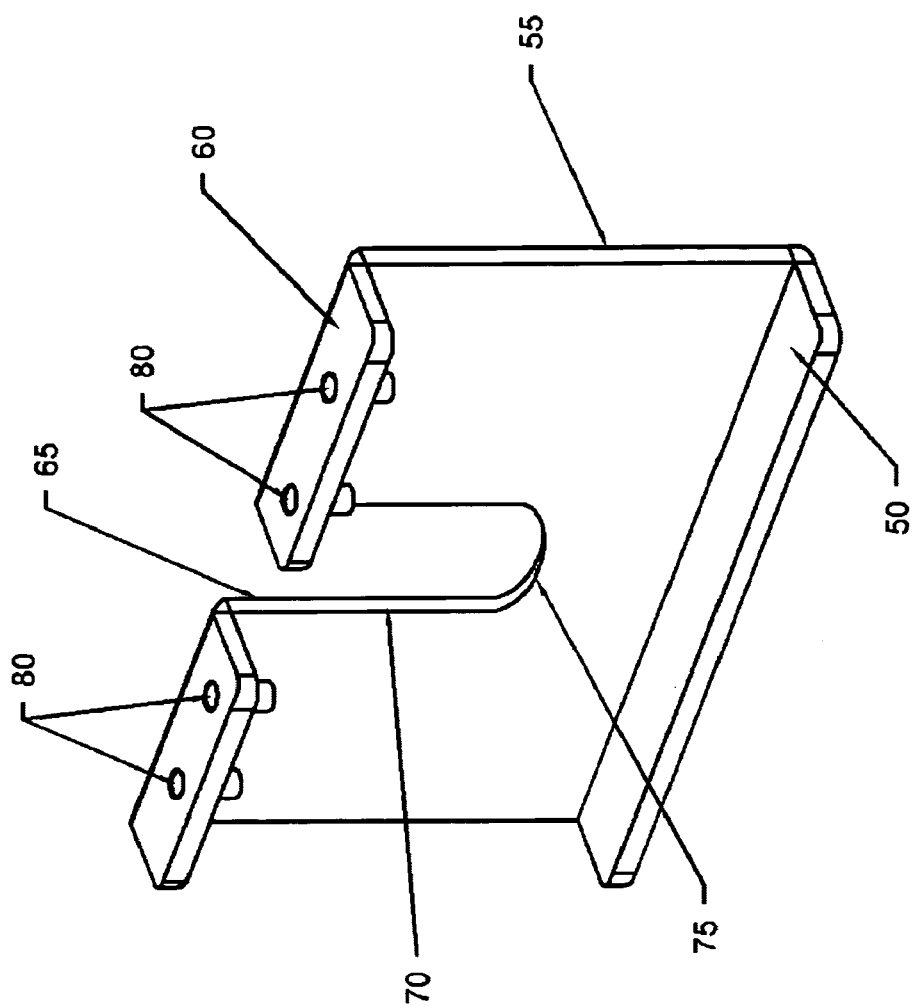
FIG. 4 is a perspective view of an insert.

Referring again to FIG. 1, inserts 45 are positioned in the interior space of the housing 10. Referring to FIG. 4, each insert includes a base 50, a dividing wall 55, and a mounting wall 60. The base 50 and the mounting wall 60 are at opposing ends of the dividing wall 55 and are generally perpendicular to the dividing wall 55. As shown, the insert 45 includes a cut-away area 65 through the center of the mounting wall 60 and extending a portion of the way down into the dividing wall 55. The edge 70 of the cut-away area 65 makes a straight line terminating in a rounded portion 75 at the approximate center of the dividing wall 55. The mounting wall 60 includes screw channels 80 that extend below the bottom edge of the mounting wall 60. In another implementation, circular ports (see FIGS. 8A and 8B) may replace the cut-away areas in the dividing walls 55.

Referring again to FIG. 2, the base 50 of each insert 45 is mounted to the bottom wall 25 and side walls 20 of the housing 10 with the mounting wall 60 positioned just beneath the open top 28 such that the interior space of the housing is separated into alternating current (AC) wiring, printed circuit board (PCB), and direct current (DC) wiring compartments 85, 90, 95. Attachment of the inserts 45 to the housing 10 may be accomplished by, for example, welding or other attachment or bonding methods.

Figure 5A:
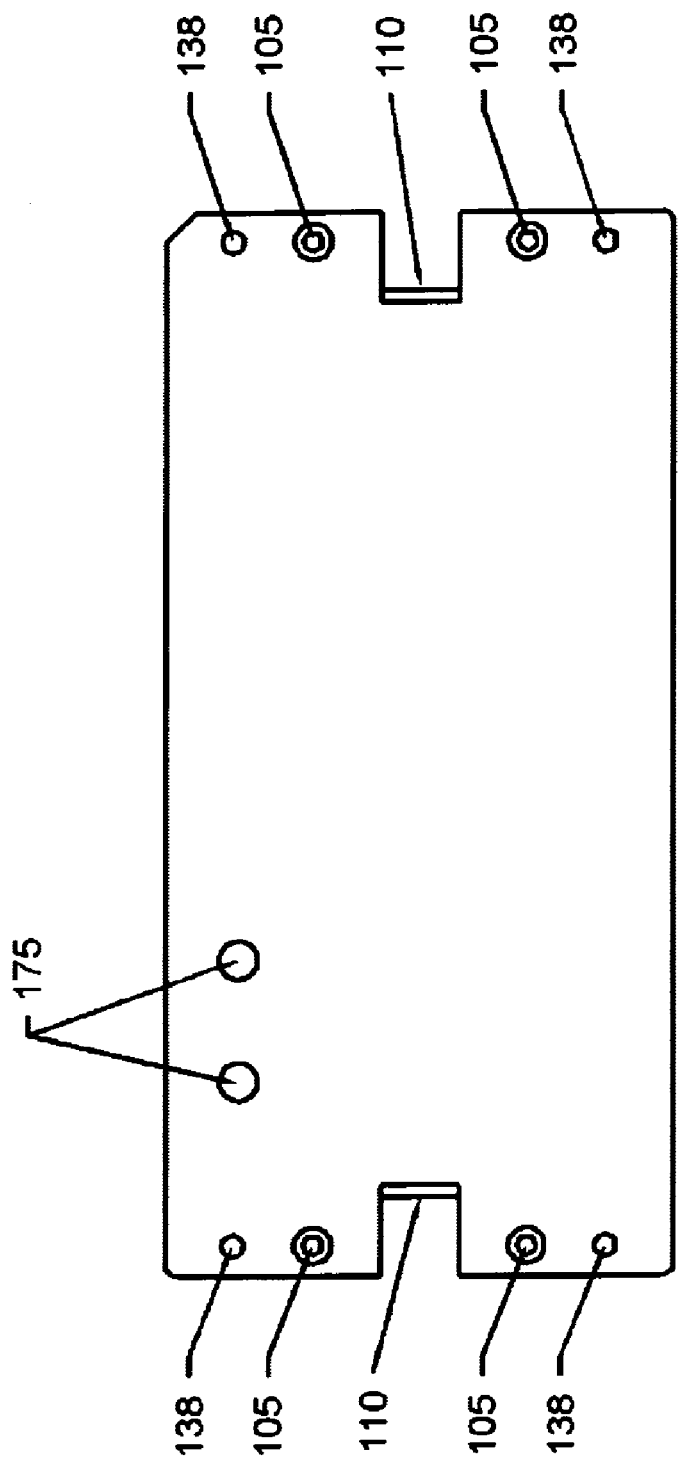
FIGS. 5A and 5B are top and side views of an inner lid.
Figure 5B:
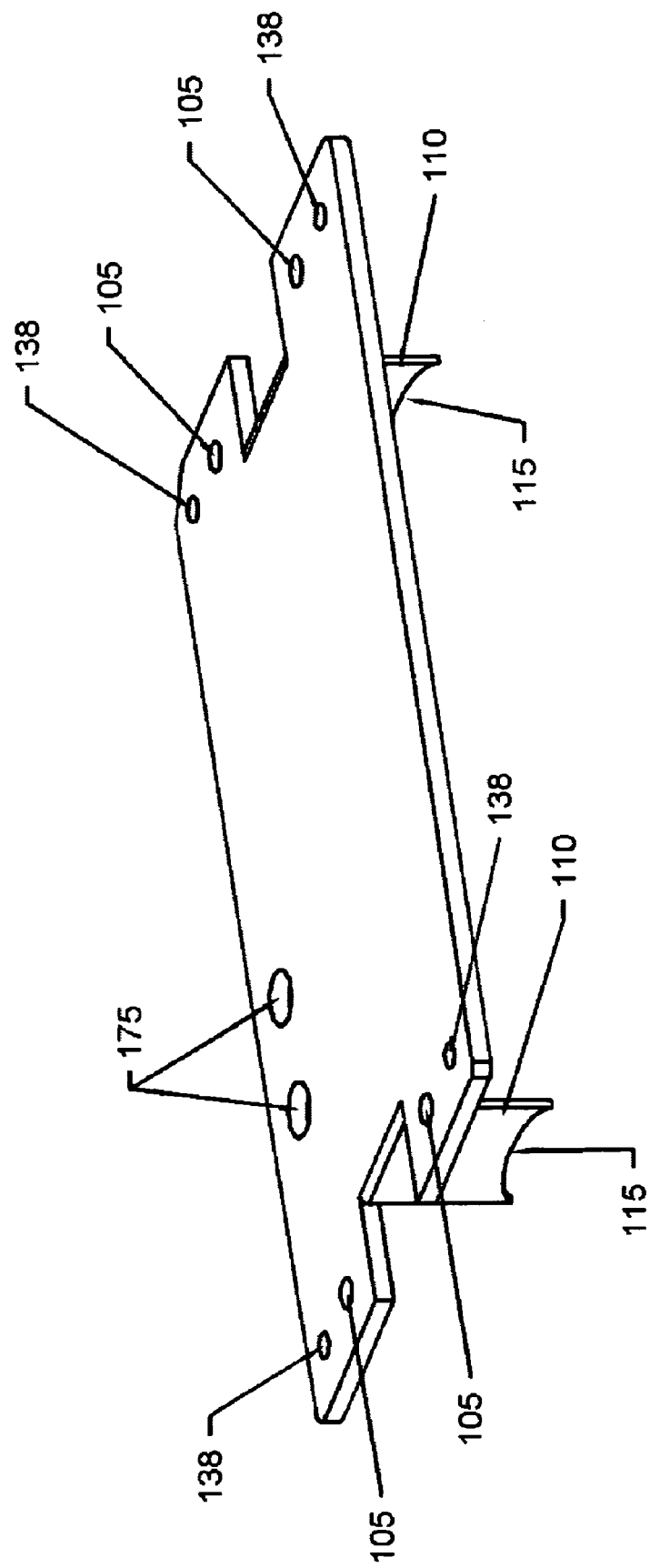

Referring to FIGS. 5A and 5B, a generally rectangular inner lid 100 attaches to the mounting walls 60 of the inserts 45 via screw holes 105. Flanges 110 at opposing ends of the inner lid 100 are perpendicular to the rectangular plane of the inner lid 100. As shown, the flanges 110 are protrusions extending from opposing ends. The flanges 110 may be formed by making parallel cuts in opposing ends of the inner lid 100 and bending the cut portions to a perpendicular position or by attaching the flanges 110 to the inner lid 100. Each flange 110 has a crescent shape or semi-circular portion 115 at the end farthest from the surface of the inner lid 100.

Installing the inner lid 100 on the housing 10 encloses the PCB compartment 90. The flanges 110 are positioned in the cut-away area 65 of the inserts 45 thereby forming a port with straight sides and semicircular top and bottom portions. As mentioned above, ports in the dividing wall may replace the cut-away areas 65, in which case, the inner lid 100 is a flat plate without the flanges 110. In either implementation, grommets are installed in the ports or in the cut-out areas 65 to protect wiring from chafing and to provide strain relief for wiring running between the PCB compartment 90 and the outer DC and AC wiring compartments 85, 95.

Referring to FIG. 6A and 6B, a generally rectangular outer cover 120 encloses the interior space of the housing 10. The outer cover has a top 125 with screw holes 130 and a lip 135. Screws (not shown) are inserted in the screw holes 130 to attach the outer cover 120 through screw holes 138 in the inner lid 100 (see FIGS. 5A and 5B) to the screw channels 80 in the mounting walls 60 of the housing 10. The top 125 is slightly larger that the exterior of the housing 10 such that the lip slides 135 over a portion of the end walls 15 and side walls 20. A series of notches 139 on the outer cover 120 provide proper alignment of the outer cover 120 on the housing 10 and provide additional rigidity to the outer cover 120.

Figure 7:
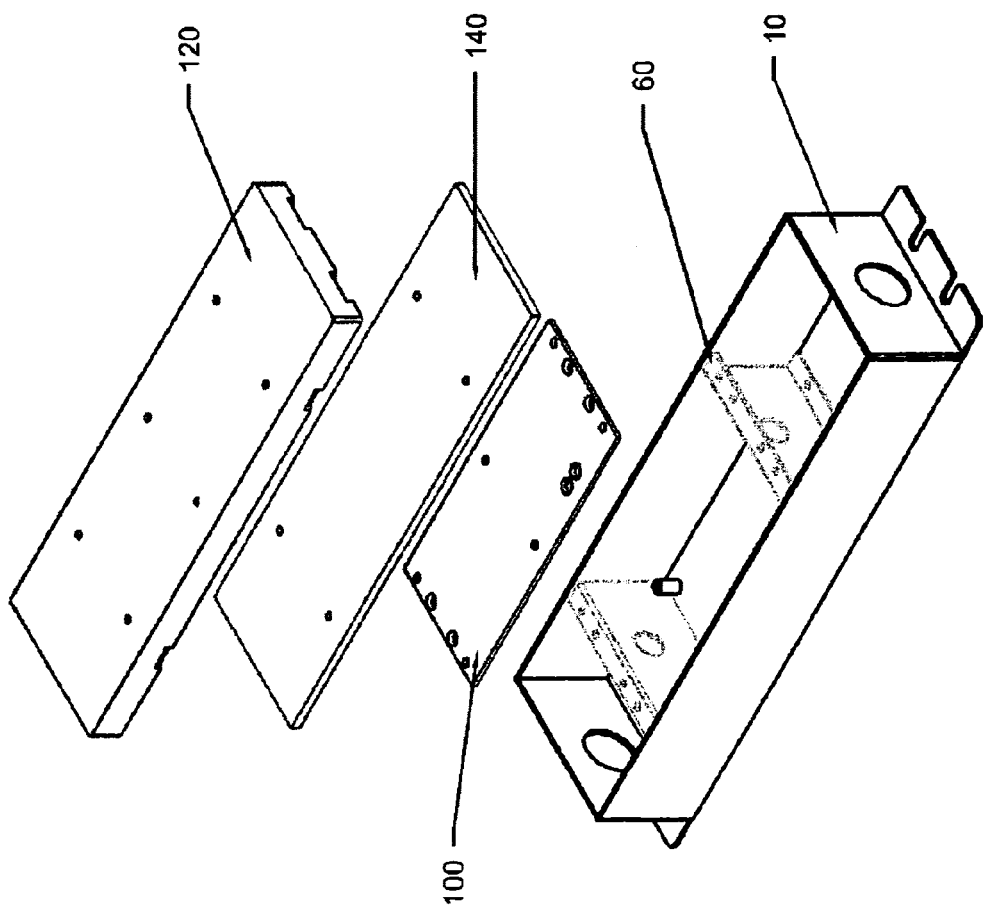
FIG. 7 is an exploded view of a power supply assembly without electrical components.

FIG. 7 shows an exploded view of the power supply assembly 5 without electrical components. The inner lid 100 attaches to the mounting walls 160. Next, the outer cover 120, which includes a gasket 140 bonded to the under-side, is installed onto the housing 10. The gasket 140 is slightly larger than the length and width of the housing 10. Thus, compression of the gasket 140 between the outer cover 120 and the housing 10 forms a watertight seal.

Figure 8A:
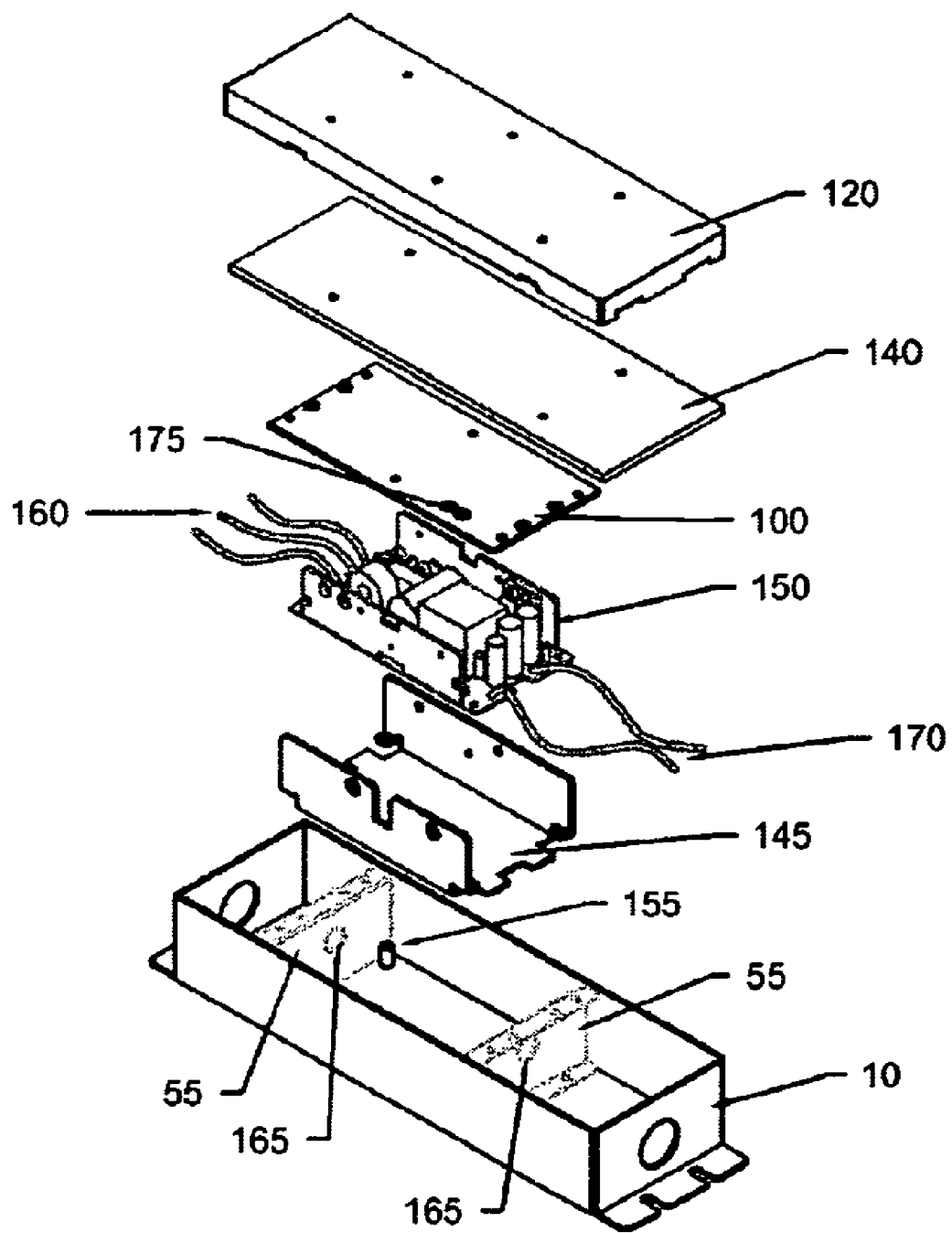
FIGS. 8A and 8B are exploded views of the power supply assembly with the electrical components.
Figure 8B:
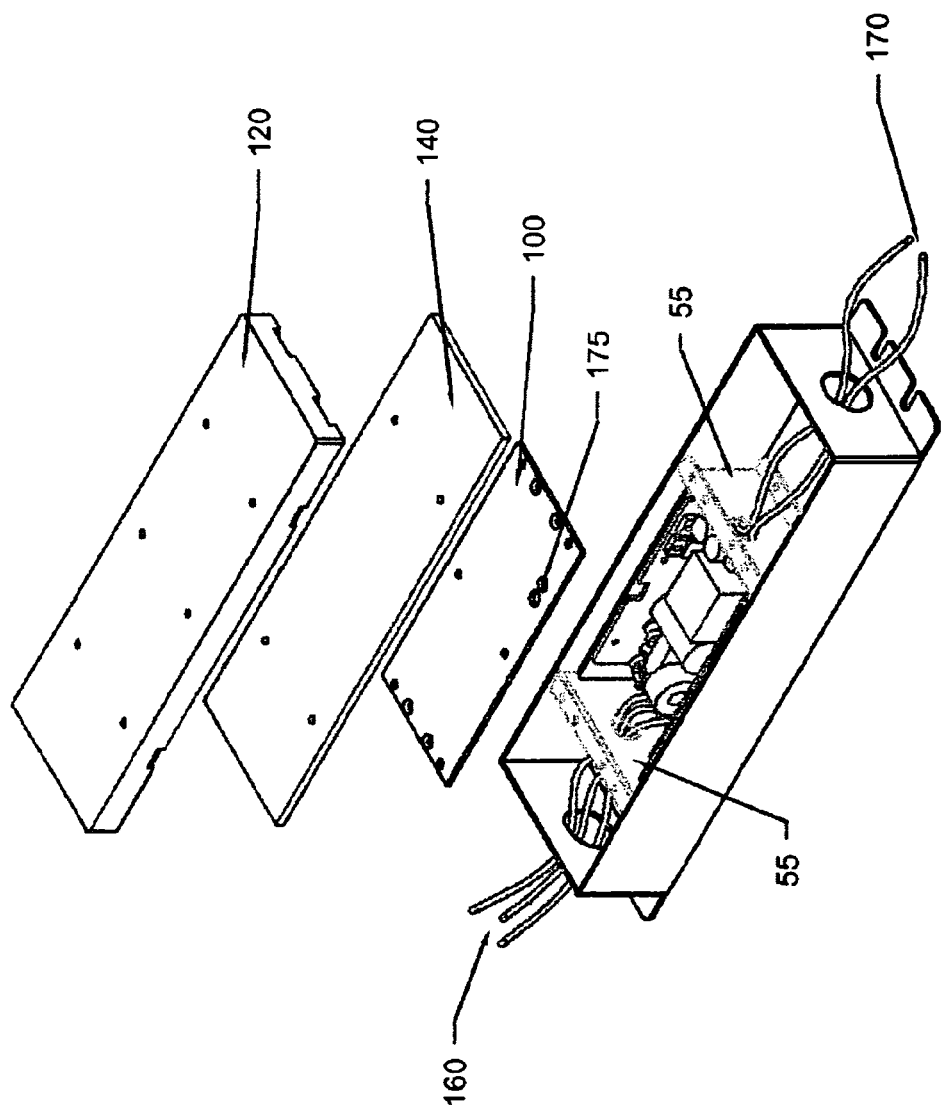

FIGS. 8A and 8B illustrate a method of assembling the power supply assembly 5. A U-shaped heat sink 145 and PCB 150 are attached to mounting bosses 155 on the bottom wall 25. AC wires 160 from the PCB 150 are passed through a port 165 in the dividing wall 55 and into the AC wiring compartment 85. DC wires 170 from the PCB 150 are passed through a port 165 in the other dividing wall 55 and into the DC wiring compartment 95. Grommets are installed in the ports 165 to protect and provide strain relief for any wiring running between the AC and DC wiring compartments 85, 95 and the PCB compartment 90.

The inner lid 100 is attached to the mounting walls 160 thereby enclosing the PCB 150 in the PCB compartment 90. Where the dividing walls 55 include cut-away areas 65 as shown in FIG. 1, the AC and DC wires 160, 170 are self-fed into respective AC and DC wiring compartments 85, 95 as the PCB 150 is lowered into the housing 10. The flanges 110 on the inner lid 100 are then used to partly enclose the cut-away areas 65 when the inner lid 100 is installed thereby forming openings similar to the ports 165 described above. Grommets are then installed in the openings. The gasket 140 is adhered to the under-side of the outer cover 120 and the outer cover 120 is tightened down onto the housing 10.

Field installation of the power supply assembly 5 is straight-forward. The technician mounts the power supply assembly 5 to a desired surface using screws that are inserted in the recesses 40 on the housing 10. The technician removes the outer cover 120 to expose the AC and DC wiring compartments 85, 95 while the inner lid 100 remains in place to protect the PCB 150.

The technician passes AC source wires (not shown) through the aperture 30 and into the AC wiring compartment 85 and wires from the DC load (not shown) through the other aperture 30 and into the DC wiring compartment 95. The AC wiring 160 is then connected to the AC source wires and the DC wiring is connected to the DC load wires. Water-tight fittings are then installed in the apertures 30 and/or electrical conduits (not shown) are attached to the apertures 30 to seal the AC and DC wire connections from outside elements.

The technician inserts a tool through access holes 175 to make current and/or voltage adjustments to the power supply output. Plastic or rubber plugs are then installed in the access holes. When the wiring and other adjustments are complete, the technician attaches the outer cover 120 (with gasket 140) to the housing 10.

Since certain changes may be made in the above apparatus without departing from the scope of the invention herein involved, it is intended that all matter contained in the above description or shown in the accompanying drawing shall be interpreted in an illustrative and not in a limiting sense. Accordingly, other implementations are within the scope of the following claims.

The invention claimed is:

1. A power supply assembly, comprising:
   a housing having a bottom wall attached to side walls and end walls defining a generally rectangular box with an interior space and an open top;
   a first dividing wall and a second dividing wall positioned in the interior space of the housing and dividing the interior space into a first compartment, a second compartment, and a third compartment;
   a printed circuit board positioned in the second compartment of the housing;
   an inner lid attached to the first dividing wall and the second dividing wall thereby enclosing the second compartment; and
   wherein the inner lid comprises at least one adjustment port to adjust an operating characteristic of the printed circuit board.

2. The power supply assembly of claim 1, wherein:
   the first dividing wall comprises a first port between the first compartment and the second compartment; and
   the second dividing wall comprises a second port between the second compartment and the third compartment.

3. The power supply assembly of claim 2, wherein:
   the printed circuit board includes alternating current wires and direct current wires at opposing ends;
   wherein the alternating current wires extend through the first port into the first compartment and the direct current wires extend through the second port into the third compartment.

4. The power supply assembly of claim 1, wherein:
   the first dividing wall and the second dividing wall comprise cut-out areas; and
   the inner lid comprises a pair of protrusions partially extending into the cutout areas to define a first port between the first compartment and the second compartment and a second port between the second compartment and the third compartment.

5. The power supply assembly of claim 1, further comprising:
   wherein the at least one adjustment port of the inner lid comprises a current adjustment port and a voltage adjustment port.

6. The power supply assembly of claim 1, further comprising:
   an outer lid covering the open top of the housing thereby enclosing the first compartment, the second compartment, and the third compartment.

7. The power supply assembly of claim 1, wherein:
   the first compartment comprises an alternating current wiring compartment;
   the second compartment comprises a printed circuit board compartment; and
   the third compartment comprises a direct current wiring compartment.

8. The power supply assembly of claim 1, further comprising:
   a U-shaped heat sink positioned in the second compartment of the housing.

9. The power supply assembly of claim 1, wherein:
   the printed circuit board includes alternating current wiring extending into the first compartment and direct current wiring extending into the third compartment.

10. The power supply assembly of claim 1, wherein each end wall comprises a port configured to receive a conduit.

11. The power supply assembly of claim 1, wherein the side walls each comprise an external connection port into the first compartment and the third compartment, each external connection port configured to receive a conduit.

12. A method of adjusting an operating characteristic of a power supply having a housing with an interior space divided into at least one wiring compartment, a printed circuit board compartment, an inner lid enclosing the printed circuit board compartment and an outer cover enclosing the interior space, the method comprising:
   removing the outer cover thereby exposing the at least one wiring compartment;
   inserting a tool through a port in the inner lid to access a power supply control; and
   manipulating the power supply control to set an operating characteristic of the power supply
   wherein the printed circuit board compartment remains enclosed by the inner lid.

13. The method of claim 12, further comprising:
   attaching the outer cover to enclose the interior space.

14. The method of claim 12, further comprising:
   connecting alternating current wires in the least one wiring compartment to an alternating current power source; and
   attaching the outer cover.

15. The method of claim 12, further comprising:
   connecting direct current wires in the least one wiring compartment to a direct current receiving load; and
   attaching the outer cover.

* * * * *